United States Patent [19]
Poschenrieder et al.

[11] Patent Number: 5,712,698
[45] Date of Patent: Jan. 27, 1998

[54] INDEPENDENTLY CONTROLLABLE SHUTTERS AND VARIABLE AREA APERTURES FOR OFF AXIS ILLUMINATION

[75] Inventors: Bernhard Poschenrieder, Poughkeepsie; Takashi Sato, Fishkill; Tsukasa Azuma, Poughkeepsie, all of N.Y.

[73] Assignees: Siemens Aktiengesellschaft, Munich, Germany; Kabushiki Kaisha Toshiba, Kanagawa-ken, Japan

[21] Appl. No.: 610,770

[22] Filed: Mar. 4, 1996

[51] Int. Cl.⁶ .................................. G03B 27/72
[52] U.S. Cl. .................... 355/71; 355/53; 355/54; 362/321
[58] Field of Search .............. 396/335; 352/204; 362/321; 378/145–153; 355/53–54, 71

[56] References Cited

U.S. PATENT DOCUMENTS

| | | | |
|---|---|---|---|
| 3,854,816 | 12/1974 | Fujimura | 355/71 |
| 3,980,407 | 9/1976 | Hill | 355/71 |
| 4,208,100 | 6/1980 | Bischl | 362/321 |
| 4,450,578 | 5/1984 | Hill | 378/152 |
| 4,458,303 | 7/1984 | Berns | 362/321 |
| 4,816,876 | 3/1989 | Pryor | 355/71 |
| 5,053,934 | 10/1991 | Krebs | 362/321 |
| 5,161,176 | 11/1992 | Ebinuma et al. | 378/152 |
| 5,194,893 | 3/1993 | Nishi | 355/53 |
| 5,264,898 | 11/1993 | Kamon et al. | 355/53 |

Primary Examiner—R. L. Moses
Assistant Examiner—Shival Virmani
Attorney, Agent, or Firm—Dexter K. Chin

[57] ABSTRACT

New types of apertures to vary the size and shape of the aperture area without the need to change the whole aperture plate in off axis lithography. The off axis illumination apertures allow the size and shape of apertures to be changed without having to change the aperture plates for each step in the lithographic process. The aperture plate is fitted with simple shutter mechanisms that allow the ready adjustment of the aperture openings.

10 Claims, 3 Drawing Sheets

INDEPENDENTLY CONTROLLABLE SHUTTERS AND VARIABLE AREA APERTURES FOR OFF AXIS ILLUMINATION

BACKGROUND OF THE INVENTION

1. Field of the Invention

The present invention generally relates to the manufacture of very large scale integrated (VLSI) circuit devices and, more particularly, to the fidelity enhancement of lithographic images through the use of off axis illumination with independently controllable shutters and variable area apertures.

2. Background Description

Manufacturing of semiconductor devices is dependent upon the accurate replication of computer aided design (CAD) generated patterns onto the surface of a device substrate. The replication process is typically performed using optical lithography followed by a variety of subtractive (etch) and additive (deposition) processes. Optical lithography patterning involves the illumination of a metallic (e.g., chrome) coated quartz plate known as a photomask which contains a magnified image of the computer generated pattern etched into the metallic layer. This illuminated image is reduced in size and patterned into a photosensitive film on the device substrate. As a result of the interference and processing effects which occur during pattern transfer, images formed on the device substrate deviate from their ideal dimensions and shape as represented by the computer images. These deviations depend on the characteristics of the patterns as well as a variety of process conditions. Because these deviations can significantly effect the performance of the semiconductor device, many approaches have been pursued which focus on CAD compensation schemes which ensure a resultant ideal image.

The performance enhancement of advanced VLSI circuitry (that is, the speed enhancement versus dimension reduction of the circuits) is increasingly limited by the lack of pattern fidelity in a series of lithography and RIE (reactive ion etch) processes at small dimensions (e.g., sub 0.5 μm). In the photolithography process, a pattern is transferred from a photomask to a photosensitive film (resist) on the wafer. In the RIE process, this pattern in the resist is transferred into a variety of films on the wafer substrate. Sometimes lithography applications suffer from low depth of focus and/or low resolution due to aperture effects. In general, the applied aperture should fit the exposed pattern; i.e., pattern size and pattern direction. But in reality, one aperture does not fit all cases. One solution to the problem is to change off axis illumination apertures to fit a specific lithographic step. To meet the requirements for each pattern, many aperture combinations are necessary. However, with fixed design apertures (no movable parts), the number of combinations is limited.

SUMMARY OF THE INVENTION

It is therefore an object of the present invention to provide new types of apertures to vary the size and shape of the aperture area without the need to change the whole aperture plate.

According to the invention, instead of providing many different aperture plates with different sized and shaped apertures, each designed for a specific lithographic step, a new design of off axis illumination apertures are provided in which the size and shape of apertures to be changed without having to change the aperture plates for each step in the lithographic process. More particularly, the aperture plate is fitted with simple shutter mechanisms that allow the ready adjustment of the aperture openings.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF THE PREFERRED EMBODIMENTS OF THE INVENTION

Figure 1:
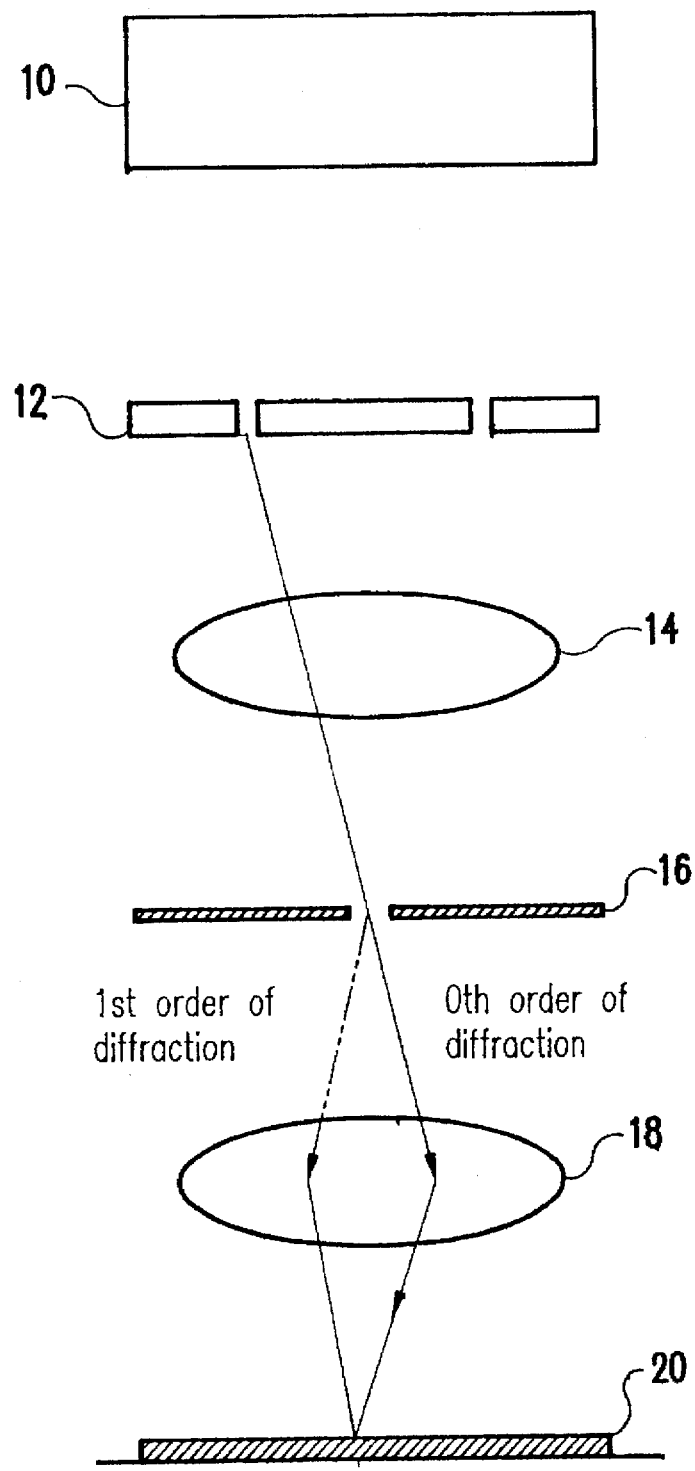
FIG. 1 is a schematic diagram showing the arrangement of an off axis illumination photolithography system as used in the practice of the invention according to a first embodiment.

Referring now to the drawings, and more particularly to FIG. 1, there is shown a schematic diagram of an off axis illumination photolithography system. A light source 10 illuminates an aperture plate 12. Light passing through the aperture plate 12 is focused by lens system 14 onto a mask 16 having small dimensions relative to the wavelength of the illuminating light such as to produce a diffraction pattern. The mask 16 is typically an etched chrome pattern on quartz. The $0^{th}$ and $1^{st}$ order diffraction components of the light passed by the mask 16 is, in turn, focused by lens system 18 onto a target 20, such as a substrate coated with a photosensitive film.

Figure 2A:
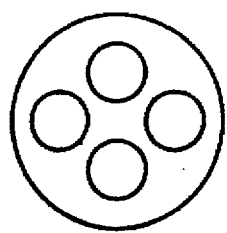
FIGS. 2A and 2B are plan views of standard apertures used in conventional off axis illumination photolithography systems.
Figure 2B:
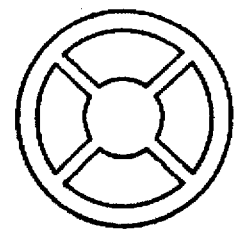

The aperture plate 12 in a conventional off axis illumination photolithographic system typically takes the form of the aperture plates shown in FIGS. 2A and 2B. The aperture plate in FIG. 2A is characterized by four off-center circular apertures located 90° apart about the center of the aperture plate forming what is known as a quadrapole aperture. The aperture plate in FIG. 2B is characterized by four pie-shaped holes with the center section occluded. Using either of these aperture plates in an off-axis illumination photolithographic system such as shown in FIG. 1 limits the control of the illumination. That is, the exposure process is direction dependent, and it is possible to optimize the exposure dose (i.e., exposure time) for only one direction. Further, lithography applications suffer from low depth of focus and/or low resolution due to aperture effects. Since one aperture does not fit in all cases, off axis illumination apertures of varying sizes and designs have been used. However, this approach requires many different apertures, each of which have to be changed to fit a specific lithography step. Even so, the number of combinations is limited and, therefore, the appropriate size and design can only be approximated.

Figure 3:
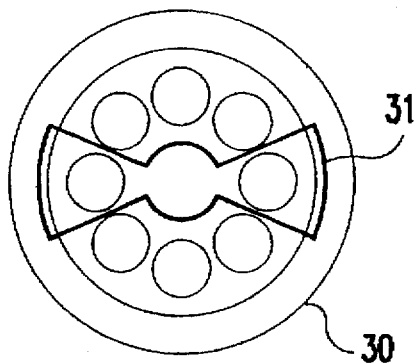
FIG. 3 is a plan view of an aperture plate fitted with a butterfly-shaped shutter which may be rotated to occlude diametrically opposite apertures in the aperture plate.

According to the invention, many different combinations of aperture openings are possible using new types of apertures to vary the size and position of the aperture area. In one embodiment of the invention shown in FIG. 3, the aperture plate 30 is not a quadrapole, but an octapole; that is, it has eight apertures equally spaced radially about the center of the aperture plate. A butterfly-shaped shutter 31 is pivotally mounted so as to occlude two diametrically opposite apertures in the aperture plate 30. This allows selection of apertures for a particular lithographic step. Clearly, the number and relative sizes of the apertures of the aperture plate 30 can be varied, as can the size and shape of the shutter 31, within the scope of the invention.

Figure 4:
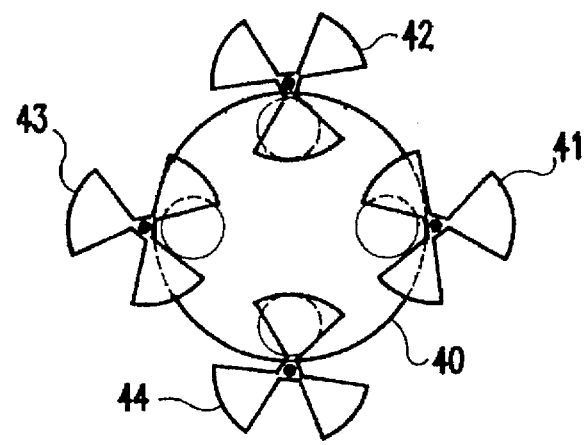
FIG. 4 is a plan view of an aperture plate like that of FIG. 2A fitted with three bladed shutters for each of the apertures in the aperture plate.
Figure 5:
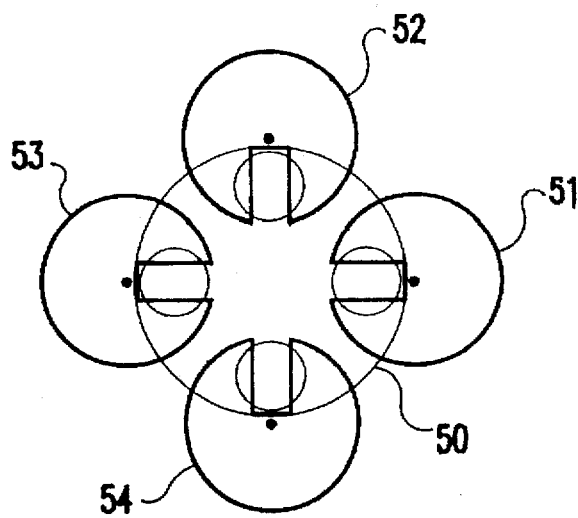
FIG. 5 is a plan view of an aperture plate like that of FIG. 2A fitted with slotted shutter disks for each of the apertures in the aperture plate.

FIG. 4 shows an aperture plate 40 like the prior art aperture plate shown in FIG. 2A modified to include three bladed shutters 41 to 44 for each of the apertures. These three bladed shutters may be individually rotated to occlude more or less of the corresponding openings in the aperture plate, one combination being shown in FIG. 4. Another variation is shown in FIG. 5 where the shutters take the form of disks 51 to 54 with radial slots. Obviously, there are many variations of slots that may be employed, FIGS. 4 and 5 showing but two examples.

Figure 6:
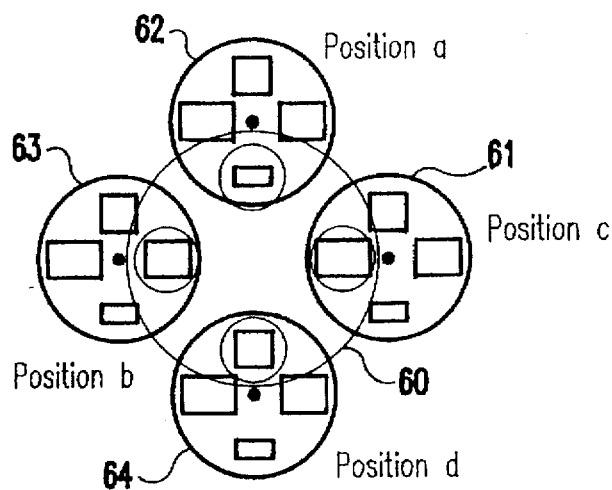
FIG. 6 is a plan view of an aperture plate like that of FIG. 2A fitted with shutter disks for each of the apertures in the aperture plate.
Figure 6A:
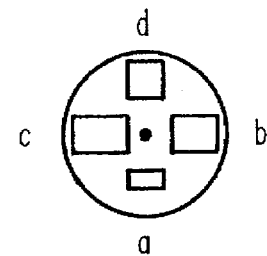
FIG. 6A is a plan view of one of the shutter disks in FIG. 6 showing four different sized and shaped rectangular openings.

FIG. 6 shows shutter disks 61 to 64 having a selection of four openings. One of the shutter disks is shown in more detail in FIG. 6A. In this example, the four openings are four different sized rectangles displaced 90° about the center of the disk. Note in FIG. 6 that the largest rectangle has corners located on the circumference of the opening in the aperture plate 60. FIG. 6 shows each of the four positions of the shutter; that is, a different sized rectangle for each of the four apertures. In practice, all four quadrapole apertures are typically covered with the same type of opening. For example, all four openings of the aperture plate would be covered with the same sized opening in the corresponding shutter plate. In some applications, perpendicular quadrapoles may have different sized openings.

Figure 7:
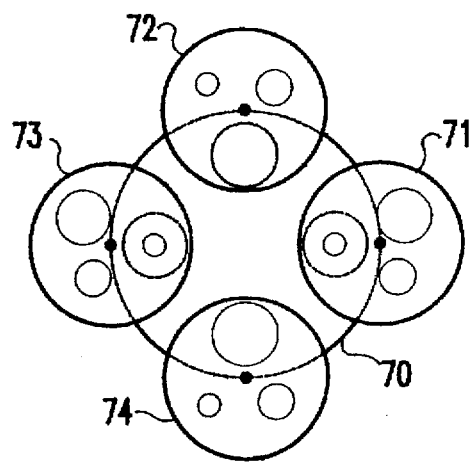
FIG. 7 is a plan view of an aperture plate like that of FIG. 2A fitted with shutter disks for each of the apertures in the aperture plate.
Figure 7A:
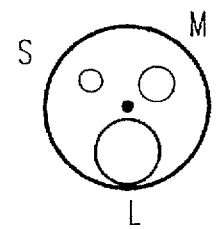
FIG. 7A is a plan view of one of the shutter disks in FIG. 7 showing three different sized and shaped circular openings.

FIG. 7 shows a variation of the shutter disks 71 to 74 having a selection of three circular openings. One of the shutter disks is shown in more detail in FIG. 7A, and in this embodiment, the largest opening in the shutter disk is the same size and, when rotated into position, location as one of the apertures on the aperture plate 70. Clearly, there are many variations in geometry and number of openings in the shutter disk, FIGS. 6A and 7A being but two examples.

Figure 8:
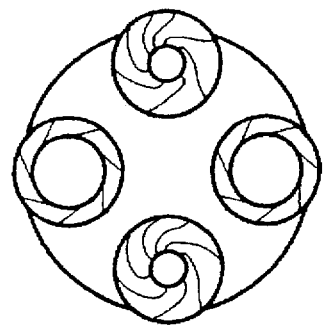
FIG. 8 is a plan view of an aperture plate like that of FIG. 2A fitted with iris apertures.

FIG. 8 shows an aperture plate fitted with iris apertures for each of the four apertures. As shown in FIG. 8, the apertures on perpendicular axes may be individually adjusted to different sizes to accommodate a specific lithographic step. The use of iris apertures provides an almost infinite variation in aperture sizes.

While the invention has been described in terms of several preferred embodiments, those skilled in the art will recognize that the invention can be practiced with modification within the spirit and scope of the appended claims.

Having thus described our invention, what we claim is new and desire to secure by Letters Patent is as follows:

1. An off axis illumination system for photolithographic exposure of a photosensitive film on a device substrate in the manufacture of semiconductor devices comprising:

an exposure source for exposing the photosensitive film;

a photomask which contains an image of pattern etched into a metallic layer, said photomask being interposed between the exposure source and the photosensitive film to be exposed;

a lens system between the photomask and the resist for focusing an illuminated image for patterning into the photosensitive film on the device substrate; and an aperture plate positioned between the exposure source and the photomask, said aperture plate providing apertures that provide off axis illumination by said exposure source of said photomask and having independently controllable shutters to provide variable area apertures, each exposure being separately optimized by adjusting the apertures for a specific lithographic step.

2. An off axis illumination system for photolithographic exposure of a photosensitive film on a device substrate in the manufacture of semiconductor devices comprising:

an exposure source for exposing the photosensitive film;

a photomask which contains an image of pattern etched into a metallic layer, said photomask being interposed between the exposure source and the photosensitive film to be exposed;

a lens system between the photomask and the resist for focusing an illuminated image for patterning into the photosensitive film on the device substrate; and an aperture plate positioned between the exposure source and the photomask, said aperture plate having independently controllable shutters to provide variable area apertures, each exposure being separately optimized by adjusting the apertures for a particular lithographic step, wherein said aperture plate has a plurality of apertures equally spaced radially about a center of the aperture plate and the independently controllable shutters comprise a butterfly-shaped shutter pivotally mounted at the center of the aperture plate and movable to occlude or partially occlude diametrically opposed apertures.

3. An off axis illumination system for photolithographic exposure of a photosensitive film on a device substrate in the manufacture of semiconductor devices comprising:

an exposure source for exposing the photosensitive film;

a photomask which contains an image of pattern etched into a metallic layer, said photomask being interposed between the exposure source and the photosensitive film to be exposed;

a lens system between the photomask and the resist for focusing an illuminated image for patterning into the photosensitive film on the device substrate; and an aperture plate positioned between the source of light and the photomask, said aperture plate having independently controllable shutters to provide variable area apertures, each exposure being separately optimized by adjusting the apertures for a specific lithographic step, wherein said aperture plate has a plurality of apertures equally spaced radially about a center of the aperture plate and the independently controllable shutters comprise a plurality of shutters, one for each of said apertures, pivotally mounted adjacent respective apertures and independently movable to occlude or partially occlude respective ones of said apertures.

4. The off axis illumination system for photolithographic exposure of a photosensitive film on a device substrate in the manufacture of semiconductor devices as recited in claim 3 wherein said shutters have a plurality of blades which may be rotated to occlude or partially occlude a respective aperture.

5. The off axis illumination system for photolithographic exposure of a photosensitive film on a device substrate in the manufacture of semiconductor devices as recited in claim 3 wherein said shutters are disks having at least one radially extending slot which may be rotated into registry with a corresponding aperture in said aperture plate.

6. The off axis illumination system for photolithographic exposure of a photosensitive film on a device substrate in the manufacture of semiconductor devices as recited in claim 3 wherein said shutters are disks having at least one aperture radially displaced from a center of the disk and which may be rotated into registry with a corresponding aperture in said aperture plate.

7. The off axis illumination system for photolithographic exposure of a photosensitive film on a device substrate in the manufacture of semiconductor devices as recited in claim 6 wherein the disks each have a plurality of apertures of different sizes each radially displaced from the center of the disk, each said aperture partially occluding in different amounts a corresponding aperture on said aperture plate when rotated into registry with the corresponding aperture.

8. The off axis illumination system for photolithographic exposure of a photosensitive film on a device substrate in the manufacture of semiconductor devices as recited in claim 7 wherein the apertures on the disks are circular holes.

9. The off axis illumination system for photolithographic exposure of a photosensitive film on a device substrate in the manufacture of semiconductor devices as recited in claim 7 wherein the apertures on the disks are rectangular holes.

10. The off axis illumination system for photolithographic exposure of a photosensitive film on a device substrate in the manufacture of semiconductor devices as recited in claim 3 wherein said shutters are iris apertures.

* * * * *